United States Patent [19]

George

[11] 4,062,003
[45] Dec. 6, 1977

[54] ONE-LEVEL MAGNETIC BUBBLE SWITCHING DEVICE

[75] Inventor: Peter K. George, Placentia, Calif.

[73] Assignee: Rockwell International Corporation, El Segundo, Calif.

[21] Appl. No.: 709,989

[22] Filed: July 30, 1976

[51] Int. Cl.² .............................................. G11C 19/08
[52] U.S. Cl. ....................................... 365/16; 365/15; 365/43; 365/19
[58] Field of Search ................................. 340/174 TF

[56] References Cited

U.S. PATENT DOCUMENTS

| 3,810,133 | 5/1974 | Bobeck et al. | 340/174 TF |
| 3,984,823 | 10/1976 | Ciak | 340/174 TF |
| 4,003,037 | 1/1977 | Chang | 340/174 TF |

Primary Examiner—James W. Moffitt
Attorney, Agent, or Firm—L. Lee Humphries; H. Fredrick Hamann; G. Donald Weber, Jr.

[57] ABSTRACT

There is described an improved switching device for use in magnetic bubble domain systems. In this device, chevron propagation paths are utilized. A pair of substantially parallel conductors are interconnected at appropriate locations via the chevrons in the respective propagation paths. The pair of conductors permits reduced amplitude requirements in the control current signal. In addition, a return path for the current signal is provided to simplify interconnection in major/minor loop chip configurations. The chevrons are arranged such that the apex of one chevron group is contained between the pair of conductor lines. The ends of adjacent chevron groups in another propagation path are disposed between the pair of conductor lines. Consequently, the magnetic bubble domain "sits" on the chevron ends longer whereby wider phase margins during a transfer operation are achieved. Annihilation of magnetic bubble domains can be achieved by reversing the current direction.

4 Claims, 15 Drawing Figures

FIG. h

ONE-LEVEL MAGNETIC BUBBLE SWITCHING DEVICE

BACKGROUND

1. Field of the Invention

This invention relates to magnetic bubble domain devices in general and to a switching ciruit in particular. The particular switch is readily suited for one-level implementation.

2. Prior Art

Magnetic bubble domain chips are now receiving a substantial amount of interest as a new information handling technology. Many chips and device components have been developed in the past. Among the components which are necessary to permit the fabrication of a chip is a switching device which will transfer information from one path to another. Switches of this type are known in the art. For example, replicate-annihilate switches are described in "Evolution of Bubble Circuits Processed by a Single Mask Level" by A. H. Bobeck et al, in IEEE Trans. on MAG., Vol. MAG-9, No. 3, Sept. 1973, pp. 474-480. This paper describes a basic replicator component which consists of two adjacent propagate channels and a conductor loop. In this component, the chevrons of the adjacent channels have the apices pointing in opposite directions, namely, toward each other. During the application of a current signal to the conductor loop, the chevron groups in the adjacent propagaton channels have like magnetic poles in alignment. Thus, when bubbles are replicated, the bubbles react to the poles of the chevrons and move in opposite directions along the propagation paths. This limitation is important in some device operations.

Reference is also made to a paper entitled "Progress in All-Permalloy Bubble Control Functions" by T. J. Nelson, AIP Conference Proceedings, No. 18, Part 1, pp. 95-99 (1974). In this paper there is described the design and operation of an all-permalloy transfer gate using adjacent propagation paths (major-minor loops) composed of chevron elements. In this transfer gate, the spices of the chevron groups in the adjacent paths are, again, pointed toward each other. However, in the transfer gate described in this publication, a single current conductor intersects the apices of the adjacent chevron element groups. Again, this transfer gate has the disadvantage that bubbles propagate in different directions in the adjacent propagation paths. It also has the disadvantage that it cannot be easily incorporated into a major/minor loop chip design because a return current path must be provided.

SUMMARY OF THE INVENTION

The instant invention relates to a switch device for use with magnetic bubble domains. In the preferred embodiment there is shown a one-level transfer/annihilate or replicate switch wherein at least two adjacent propagation paths utilizing chevron element groups are arranged so that bubbles can be transferred from one path to the other. In this switch the propagation paths are offset by one half-period shift in channel position and the apices of the chevron element groups point in the same direction. A conductor loop comprising a pair of substantially parallel conductor paths are joined at one end to form a loop around the apices of the chevrons in one propagation path and around the ends of a pair of chevron element groups in the other path. In this manner, bubbles are transferred from one path to the other and propagation in the same or continuing direction is maintained.

BRIEF DESCRIPTION OF THE DRAWINGS

FIGS. 2a-2h are schematic diagrams of the transfer switch of the instant invention showing a detailed analysis of the transfer of a bubble from one propagation path to the adjacent propagation path.

DESCRIPTION OF A PREFERRED EMBODIMENT

Figure 1A:
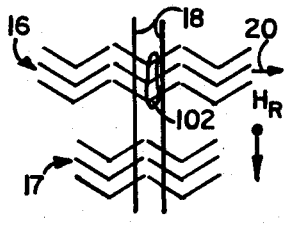
FIGS. 1a and 1b are schematic representations of transfer gates known in the prior art.
Figure 1A:
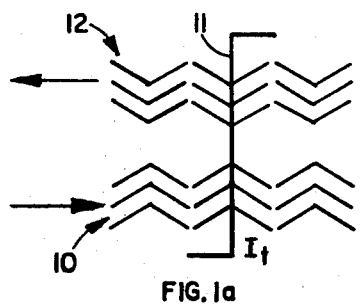
Figure 1B:
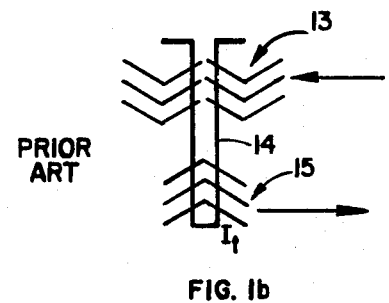

Referring now to FIGS. 1a and 1b, there are shown examples of switching devices which are known in the art. In particular, FIG. 1a represents the one-level transfer gate which is shown and described by Nelson in the reference noted supra. Similarly, FIG. 1b represents the two-level switch shown and described by Bobeck et al as noted supra. The analysis of these devices is not described in detail herein but reference is made to the appropriate publication for more information. Briefly, however, it is assumed that bubbles propagate along propagation path 10 from left to right. In the absence of a current signal in conductor 11 the propagation will proceed through path 10 as usual. However, with the application of a current signal to conductor 11 at the appropriate instant a bubble propagating along path 10 will be blocked on the left side of conductor 11 and, ultimately, stretched out therealong to engage the chevron column or group in propagation path 12. Thus, it is seen that a bubble is tranferred from propagation path 10 to propagation path 12 in response to a current signal on conductor 11. Moreover, it is clear that a transferred bubble propagates in the opposite direction, i.e. right to left, from the initial bubble.

Referring now to FIG. 1b, there is shown the prior art device which is described by Bobeck et al, as noted supra. In this device, the bubble propagates along one path, for example path 13, in the usual fashion. With the application of a current signal at the appropriate time, a bubble is "trapped" between the parallel runs of conductor 14 wherein the bubble stretches and strips out to engage the chevrons in propagation path 15 as well. Thereafter, in response to a rotating field $H_R$ and the removal of the current signal, the bubble will propagate along path 15 in the opposite direction from path 13.

Figure 2A:
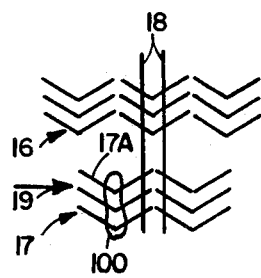

Referring now to FIG. 2a, there is shown an improved one-level transfer switch for use with magnetic bubble domains. In this embodiment, a pair of adjacent propagation paths 16 and 17 are formed using typical chevron elements. However, in the embodiment shown in FIG. 2a, the apices of the chevrons in paths 16 and 17 all point in the same direction. Moreover, it is seen that the chevron groups or columns in path 16 and 17 are offset by one half-period. Thus, the gap between the ends of chevrons in one path are aligned with the apex of the chevron column in the other path. In addition, conductor loop 18 is arranged to contain the apices of the chevrons in one column of path 16, for example, and the gap and the ends of adjacent chevron columns in path 17. The contained apices and chevron ends represent opposite polarity poles which are substantially aligned.

Figure 2B:
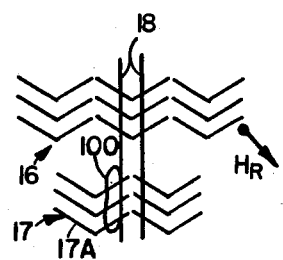

Referring concurrently to FIGS. 2a-2h, there is shown the operatoion of the switch in transferring a bubble from path 17 to path 16. Beginning with FIG. 2a, it is noted that bubbles propagate through path 17 in the direction indicated by arrow 19. Bubble 100 sits at the apices of the chevrons in chevron column 17A as a result of the effect of rotating field $H_R$. When rotating field $H_R$ has rotated, as shown in FIG. 2b, bubble 100 propagates toward the right ends of the chevrons in chevron column 17A/

Figure 2C:
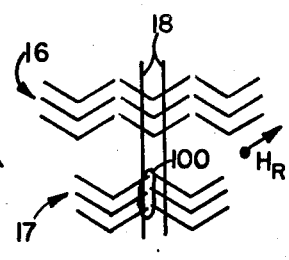

As shown in FIG. 2c, when rotating field $H_R$ reaches the appropriate position, bubble 100 achieves a position at the right ends of chevrons 17A in path 17.

Figure 2D:
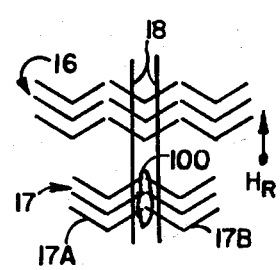
Figure 2E:
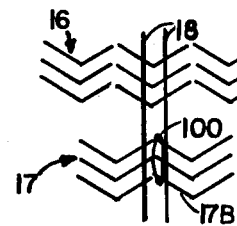

When rotating field $H_R$ assumes the substantially vertical position as shown in FIG. 2d, magnetic poles are generated at the ends of the chevrons in chevron groups 17A and group 17B. Thus, the bubble 100 tends to strip out between the chevron groups and to straddle the gap therebetween.

Figure 2F:
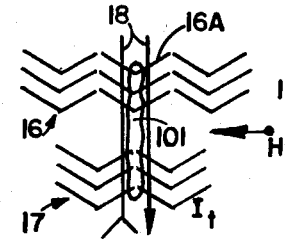

As field $H_R$ continues to rotate, bubble 100 is transferred to the ends of chevrons in chevron group 17B. At this time, current $I_t$ is applied to conductor 18. The current signal has the effect of generating a magnetic field around conductor 18 which magnetic field essentially overwhelms the magnetic field produced by rotating field $H_R$. The magnetic field associated with conductor 18 causes the bubble to strip out and extend from the ends of the chevrons in chevron group 17B to the apices of the chevrons in chevron group 16A in path 16, as shown in FIG. 2f.

Figure 2G:
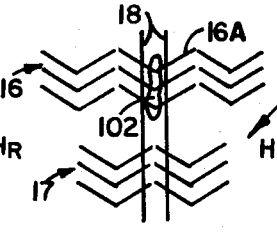

When the rotating field $H_R$ achieves the position shown in FIG. 2g, the current signal is terminated wherein conductor 18 has little or no magnetic effect on the circuit. Because of the poles produced at the apices of the chevrons in chvron group 16A as a result of rotating field $H_R$, bubble 102 is maintained at the apices of chevrons in chevron group 16A.

As rotating field $H_R$ continues to rotate as shown in FIG. 2h, bubble 102 begins to propagate through path 16 inasmuch as a magnetic pole is produced in the conductor 18. As field $H_R$ continues to rotate, bubble 102 continues to propagate through path 16 in the direction indicated by arrow 20. Thus, it is seen that a magnetic bubble domain is transferred from one propagation path to another witout a change of direction while permitting a current loop to have the current applied and received at the same side of the bubble domain circuit.

Figure 3:
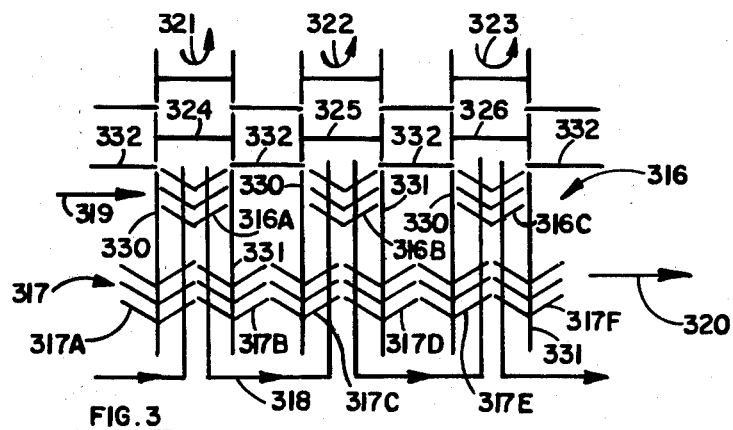
FIG. 3 is another embodiment of the transfer switch of the instant invention as utilized in a major-minor loop application.

Referring now to FIG. 3, there is shown an application of the transfer switch of the instant invention. In this embodiment, the transfer switch is implemented in a one-level manor/minor loop chip. Thus, the major loop path is suggested by path 317. The adjacent path 316 is represented by the chevron columns 316A, 316B, and 316C, respectively. Each of these chevron columns is associated with a separate minor loop represented by the arrows 321, 322 and 323. Each of the minor loops includes, for example, suitable elements such as H-bars 324, 325 and 326. These elements represent the elements or devices which are utilized to form the respective minor loops. The chevron elements along with I-bars 330, 331 and 332 form corners or ends to the respective loops. A single conductor 318 is arranged to form a conductor loop associated with each minor loop to effect selective transfer from the respective minor loops to the major loop path. In particular, assume that no current signal is applied to conductor 318. In this condition, bubbles propagating along path 317 will continue to propagate therealong from left to right as indicated by arrow 320 in response to field $H_R$. Likewise, bubbles propagating around loops 321, 322 and 323 will continue to propagate therearound as indicated by the respective arrows wherein bubbles propagate through the chevron columns 316A, 316B and 316C in the direction indicated by arrow 319. Of course, the bubbles in the respective minor loops will propagate around the corners defined by I-bars 332 and 330, the appropriate chevron column, I-bar 331 to the next I-br 332 and thence along the associated minor loop.

If now a transfer function is desired, it is assumed that a bubble is propagatng along path 317. This bubble propagates through chevron colums 317A toward column 317B as suggested in FIGS. 2a-2e. At the appropriate time, the current signal will be applied to conductor 318 wherein the bubble will transfer to chevron column 316A as suggested in FIGS. 2f-2h. The bubble in chevron column 316 then propagates along minor loop 321 in typical fashion. Of course, the transfer can take place from chevron column 317D to chevron column 316B and from chevron column 317F to chevron column 316C by applying the current pulse at the appropriate time.

A transfer of the bubble from path 316 to 317 can be effected in a similar fashion. Moreover, it is also conceivable that the transfer from 317 to 316 may be a unidirectional transfer anf that outputs from minor loops 321, 322 and 323 can be taken from the other ends thereof (not shown) by any suitale apparatus.

Referring now to FIGS. 4a-4d, there are shown a plurality of suitable terminations for the conductor loops. For example, in FIG. 4a the conductor loop 418 comprises a pair of substantially parallel lines which are disposed on opposite sides of the gap defined between the ends of chevron columns 417a and 417b, respectively. However, unlike the arrangement shown in the other figures, the ends of lines 418 are not merely joined together by a shortcircuitung chevron conductor portion. Rather, the conductors are conneced together by short stubs 418A and 418B which are interconneced and interposed between respective chevrons of chevron column 416. Thus, the current path is established using lines 418, 418A, 418B and those portions of the chevrons of column 416 which interconnect the conductor portions. This arrangement permits a complete circuit to be formed while omitting the straight sections of the conductor extending through the chevrons.

Figure 4A:
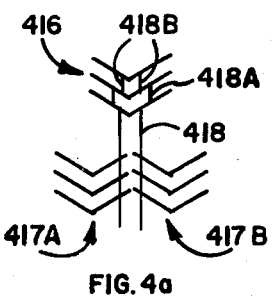
FIGS. 4a-4d are schematic diagrams of the transfer switch of the instant invention with different terminations of the conductor loop.
Figure 4B:
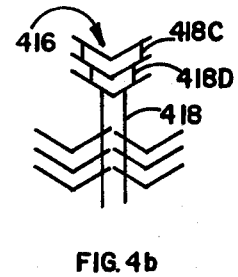

Referring now to FIG. 4b, there is shown a variation on the termination of conductor 418. In this instance, short conductor stubs 418C and 418D are interconnected between the chevrons of chevron column 416. However, in this instance, stubs 418C are disposed beyond (i.e. further from the apex) conductor segments 418D which are also spaced beyond conductors 418. The advantage of the device in FIG. 4b is that the apex poles are not altered substantially.

Figure 4C:
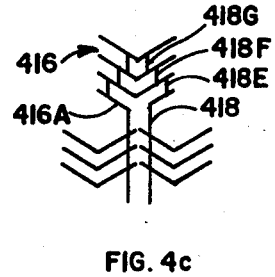

Referring now to FIG. 4c, there is shown another embodiment of a termination of conductor 418. Again, short stub conductor elements 418E, 418F and 418G are interconnected between the chevron elements of chevron column 416. However, it should be noted that the bottommost chevron 416A is not a complete chevron but, in fact, represents short stub elements which are connected to conductor 418. Thus, the effect of an additional chevron is achieved while the pole formed at the apex of the bottommost chevron is avoided.

Figure 4D:
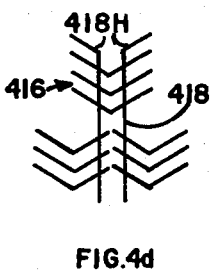

Referring to FIG. 4d, there is shown another embodiment of the termination of conductors 418. In this embodiment, conductors 418 pass through chevrons which form chevron column 416 in the usual fashion. However, the ends 418H of conductors 418 are flared rather than joined. The interconnection between the vertical or parallel portions of conductor 418 is accomplished through the chevrons of column 416. However, the ends 418H of the conductors are flared so as to provide additional pole strength for magnetic bubbles at the chevron ends without causing an unusually large magnetic field in the central area of the chevron column.

Thus, there has been shown and described an improved magnetic bubble domain transfer switch. This transfer switch is fabricated using one-level techniques and provides the inherent advantages thereof. In addition, this transfer switch permits the control conductor to be returned to the same side of the device for ease in chip design. Moreover, the transfer switch of the intsant invention permits bubbles to be transferred from one propagation path to an adjacent propagation path while maintaning the same direction of propagation. In addition, several schemes or techniques for terminating the conductor pattern are shown and suggested. These conductor patterns facilitate the fabrication of the transfer switch during the typical magnetic bubble domain fabrication process. While it is understood that those skilled in the art may conceive modifications to the circuit shown and described herein, any modifications which fall witin the purview of this description are intended to be included herein. This description is not intended to limit the scope of the application. Rather, the scope of this invention is defined by the claims appended hereto.

Having thus described the preferred embodiment of the invention, what is claimed is:

1. A one-level transfer switch for use with magnetic bubble domains comprising
   a first propagation path comprising at least one column of chevrons,
   a second propagation path comprising at least two columns of chevrons,
   all of the columns of chevrons having the apices thereof pointing in the same direction,
   the apices of said one column of chevrons aligned with the gap between said at least two columns of chevrons, and
   a pair of substantially parallel conductor elements arranged on opposite sides of the apices of the chevrons in said one column and said gap between said at least two columns of chevrons,
   said pair of conductor elements joined together at one end thereof by means of at least one chevron in said one column.

2. The one-level transfer switch recited in claim 1 including
   means for applying a rotating magnetic field to produce magnetic poles in said chevrons such that magnetic bubbles can propagate through said first and second propagation paths, and
   means for selectively supplying a current signal to said conductor elements to block the propagation of a bubble through one of said paths and causing said bubble to transfer to the other of said paths.

3. The one-level transfer switch recited in claim 1 wherein
   said conductor elements include portions thereof interconnected between chevrons in said one column of chevrons in a pattern of different widths from the apices of said chevrons.

4. The one-level transfer switch recited in claim 1 wherein
   said pair of conductor elements have ends which project beyond said one column of chevrons and flare outwardly to supplement the pattern of said one column of chevrons.

* * * * *